(12) United States Patent
Chen

(10) Patent No.: US 6,642,614 B1
(45) Date of Patent: Nov. 4, 2003

(54) MULTI-FUNCTIONAL MEMORY CHIP CONNECTOR

(75) Inventor: Wen-Yen Chen, Taipei Hsien (TW)

(73) Assignee: Teconn Electronics, Inc., Taipei Hsien (TW)

( * ) Notice: Subject to any disclaimer, the term of this patent is extended or adjusted under 35 U.S.C. 154(b) by 0 days.

(21) Appl. No.: 10/224,518

(22) Filed: Aug. 21, 2002

(51) Int. Cl.[7] ............................................... H01L 23/52
(52) U.S. Cl. ........................ 257/690; 257/685; 257/686; 257/687; 257/723; 257/730
(58) Field of Search ................................ 257/690, 685, 257/686, 687, 723, 730; 439/64, 377, 630

(56) References Cited

U.S. PATENT DOCUMENTS

| | | | | |
|---|---|---|---|---|
| 5,176,523 A | * | 1/1993 | Lai | 439/64 |
| 5,824,950 A | * | 10/1998 | Mosley et al. | 174/52.4 |
| 6,352,445 B2 | * | 3/2002 | Takei et al. | 439/489 |
| 6,438,638 B1 | * | 8/2002 | Jones et al. | 710/301 |
| 2002/0132528 A1 | * | 9/2002 | Harasawa et al. | 439/630 |

* cited by examiner

*Primary Examiner*—Richard Elms
*Assistant Examiner*—Douglas Menz
(74) *Attorney, Agent, or Firm*—Bacon & Thomas, PLLC

(57) ABSTRACT

A multi-functional memory chip connector includes an insulation frame having a memory chip insertion portion, a plurality of connecting slots on an inside surface of the memory chip insertion portion for electrically coupling a variety of memory chips, and a plurality of connector terminals extending from the connecting slots and distributed to three sides of the insulation frame for electrically coupling with a circuit board. The connector also includes a plurality of card insertion slots for receiving a plurality of memory chips with various connection specifications, and an upper lid for mounting on the top of the insulation frame.

8 Claims, 13 Drawing Sheets

MULTI-FUNCTIONAL MEMORY CHIP CONNECTOR

BACKGROUND OF THE INVENTION

1. Field of the Invention

The present invention generally relates to a multi-functional memory chip connector for an information apparatus, and more particularly to a multi-functional memory chip connector having the capability of electrically connecting a variety of memory chips having different specification With a circuit board.

2. Description of the Related Art

Nowadays computer technology is rapidly developing, and the trend of computer technology development is for better calculation functionalities and faster speed. Conventional schemes for extending memory use a network card, a modem and SCSI equipment (such as a large capacity hard disk and scanner), an electronic card the computer, or an electronic dictionary. Typically, a memory electronic card used in a computer is a PCMCIA (personal computer memory card international association) card. The conventional PCMCIA card comprises a design allowing modification of its connector into another connector type suitable for connection on a variety of circuit boards, such as PCMCIA to SCSI, PCMCIA to IDE and so on, thus enabling a user, for example, to connect the PCMCIA card through a suitable adapter connector in a personal computer, or a notebook computer. Most of the notebook computers require plug and play ability, and even require the use of a hot plug without having to reboot the computer. In addition, there are other different types of memory chips suitable for use in electronic devices such as a PDA, pocket electronic dictionary, and other related electronic devices. Therefore, PCMCIA is not the only memory chip available, but to the contrary there are other memory chips such as MMC (multimedia card), CF (compact flash card), SMC (smart media card), MS (memory stick), SD (secure digital memory card), and others.

Typically, a memory chip is electrically coupled with a circuit board by connecting the connector of the electronic card with a socket of the circuit board for both electrical and mechanical connection. But due to the specification difference of a variety of memory chips, as well as due to the size and shape difference, the connector of the memory chip needs to be modified to fit a specified type of connector suitable for electrically coupling with a circuit board and thereby allow retrieval of information. In addition, in order for the connector to accommodate the size and shape of various memory chips, the thickness of adaptors, which are used for modifying the connectors of the memory cards suitable for electrically coupling with a circuit board, must be similarly specified. However, if the thickness of an adaptor is over 4.2 mm, then it is not suitable for installing on a PCB of a notebook. Therefore, it is preferable that adaptors are thinner than 4.2 mm for the notebook PCB. For example, supposing the type of the memory chip in the computer is a PCMCIA memory chip having a thickness of 4 mm, then the space occupation of the memory chip over a circuit board is correspondingly smaller. Therefore, the space occupation of the memory chip is limited by the thickness of connector. Thus, for allowing the use of a variety of memory chips, installation of a variety of adapter connectors suitable for connection of a variety of memory chips with the PCB becomes necessary. Obviously, the usage of a variety of connectors over the PCB will result in a larger space occupation, thus limiting further integration of devices on the PCB. Further, since a conventional connector includes a plurality of connector terminals laid out internally in a cross stacking manner, this arrangement requires a larger space, and therefore results in an increase not only in the thickness of the connectors but also an increase in the size. Therefore, such connectors will occupy larger space on the PCB. Accordingly, a thinner and smaller sized connector is highly desirable for effectively reducing the space occupation on the PCB so that the level of integration of devices can be further increased.

SUMMARY OF THE INVENTION

Accordingly, in the view of the foregoing, the present inventor has made a detailed study of related art to evaluate and consider, made use of years of accumulated experience in this Field, and conducted several experiments, to create a connector suitable for connecting a variety of memory cards to the circuit board. The present invention provides a multi-functional memory chip connector, which allows the use of the same connector for electrically coupling with a variety of memory cards, thus effectively eliminating the need for a variety of connectors on the circuit board to accommodate each type of memory card. The space occupation on the circuit board can also be effectively eliminated, so that the integration of the devices on the circuit board call be effectively increased.

According to one aspect of the present invention, a multi-functional memory chip connector is provided. The multi-functional memory chip connector comprises an insulation frame having a memory chip insertion portion, a plurality of connecting slots on an inside surface of the memory chip insertion portion, and a plurality of connector terminals extending from the connecting slots, and distributed to three sides of the insulation frame for electrically coupling to a circuit board. The plurality of connector terminals that extend towards a right side of the insulation frame are extended along a right sidewall of the insulation frame, and a portion of the other end each of said connector terminals are protruded in a direction away from the right sidewall to form a footing structure. The plurality of connector terminals that are extended towards a left side of the insulation frame are extended along a left sidewall of the insulation frame, and a portion of the other end each of said connector terminals protrude in a direction away from the left sidewall to form a footing structure. The plurality of connector terminals that are extended towards a real side of the insulation frame are extended along a rear sidewall of the insulation frame, and a portion of the other end each of said connector terminals protrude in a direction away the rear sidewall to form a footing structure. Finally, the connector also includes a plurality of insertion slots for receiving a plurality of memory chips with various specifications, and an upper lid for mounting on the top of insulation frame.

According to another aspect of the present invention, a single connector comprising a plurality of slots suitable for electrically connecting with a variety of memory chips having various connection specifications, is provided.

According to another aspect of the present invention, the plurality of connector terminals are arranged in cross stacked manner. Therefore, the size of the multi-functional adaptor can be smaller, for example about 4 mm, which is suitable for electrically coupling a PCB of a notebook computer.

According to another aspect of the present invention, the plurality of connector terminals extending from the connecting slots are distributed to three sides of the insulation frame for electrically coupling a circuit board. Further, the connecting slots are used for electrically coupling the memory chip to the circuit board.

According to another aspect of the present invention, the multi-functional memory chip connector can be both electrically and mechanically coupled onto a printed circuit board.

According to anointer aspect of the present invention, the slots of the multi-functional memory connector inside the insulation frame face towards an outer side of the PCB, therefore allowing easy and fast insertion of the memory.

DESCRIPTION OF THE PREFERRED EMBODIMENT

Figure 1:
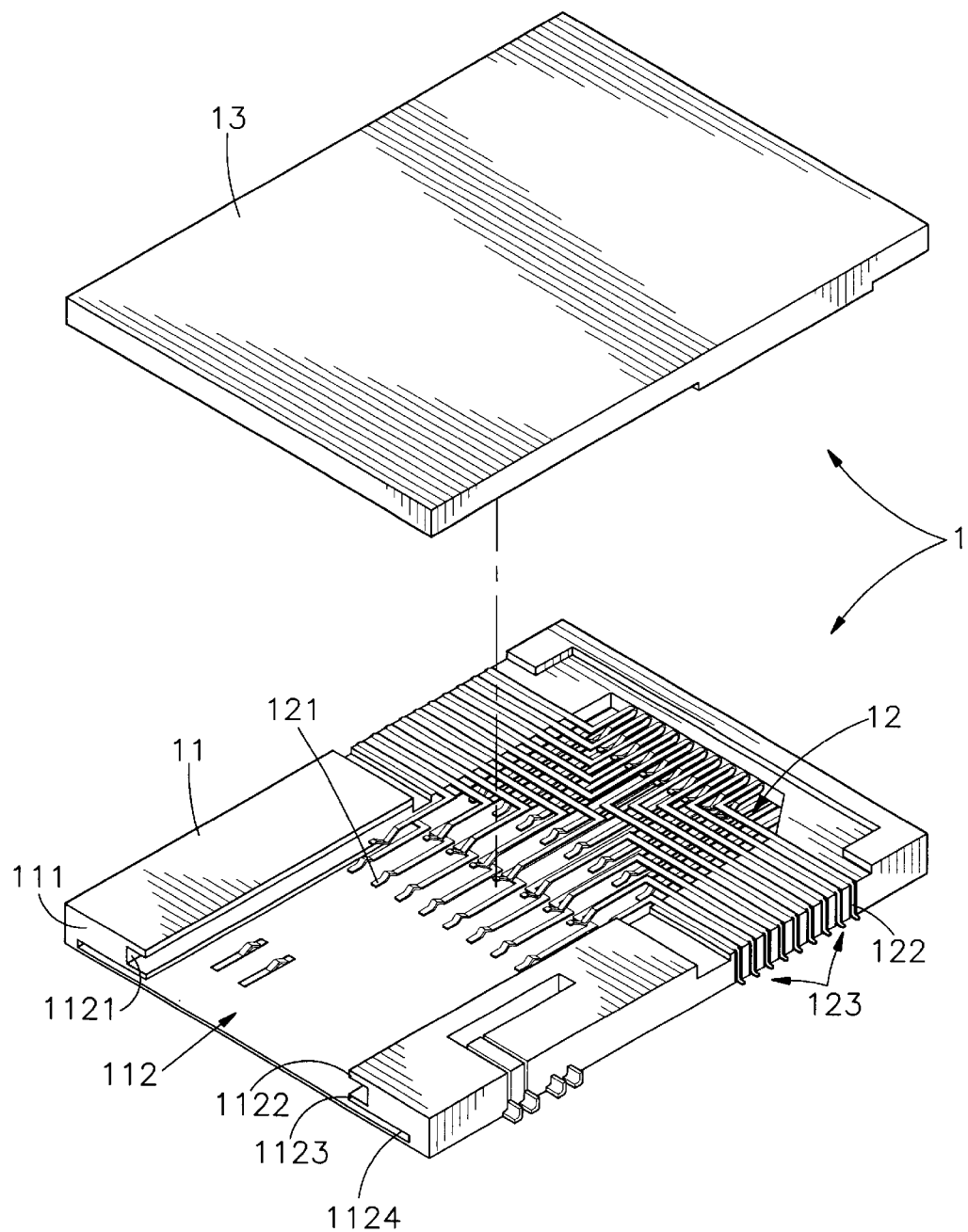
FIG. 1 is an exploded view of the multi-functional memory chip connector, in accordance with an aspect of the present invention.
Figure 2:
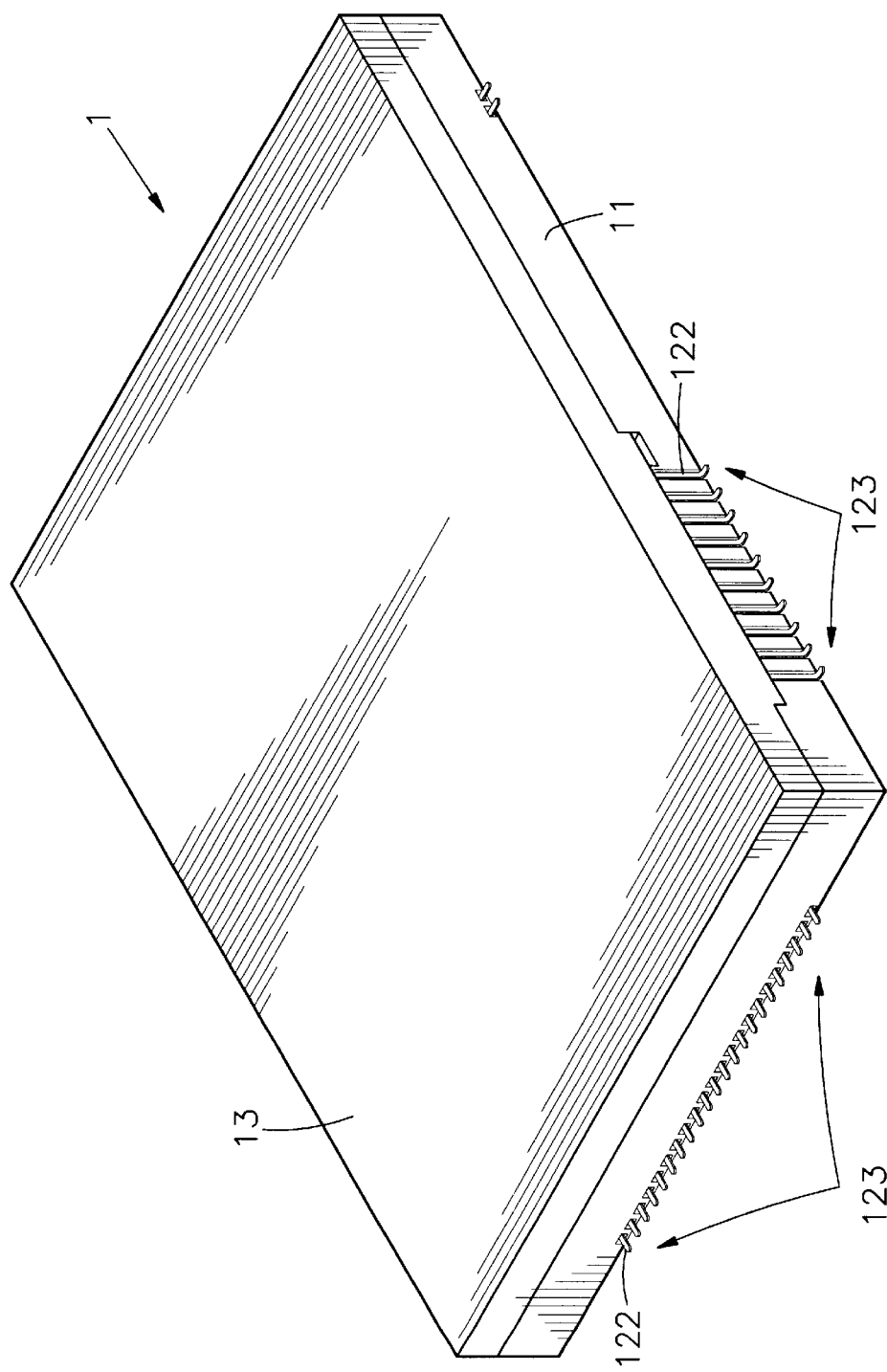
FIG. 2 is an elevational view of the multi-functional memory chip connector, in accordance with an aspect of the present invention.
Figure 3:
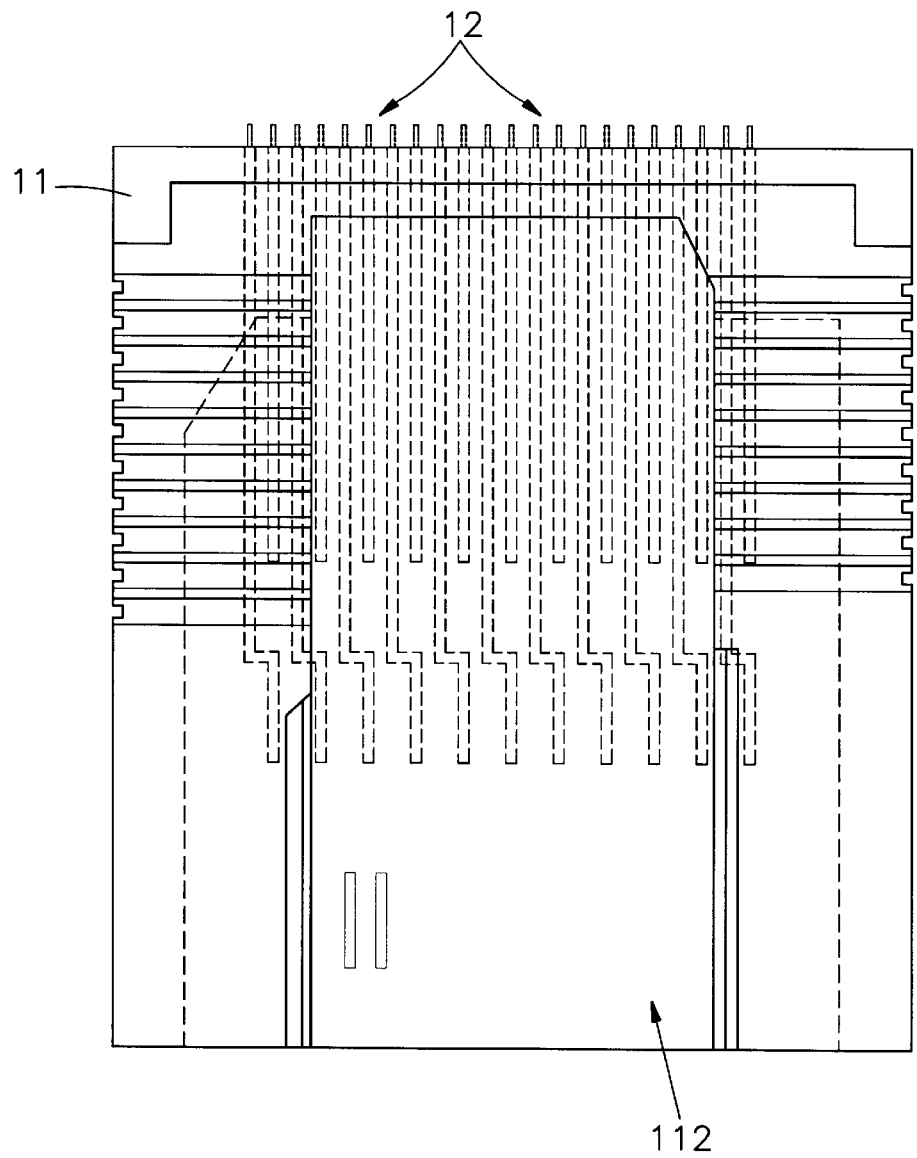
FIG. 3 is a top sectional view of the multi-functional memory chip connector, in accordance with an aspect of the present invention.
Figure 3A:
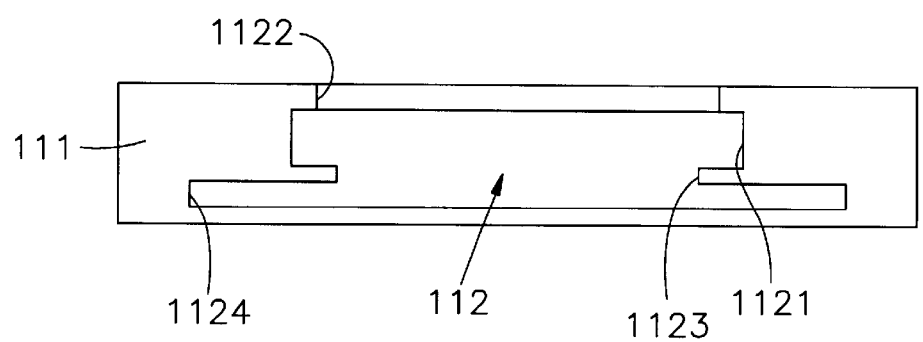
FIG. 3A is a front view of the multi-functional memory chip connector, in accordance with ail aspect of the present invention.
Figure 4:
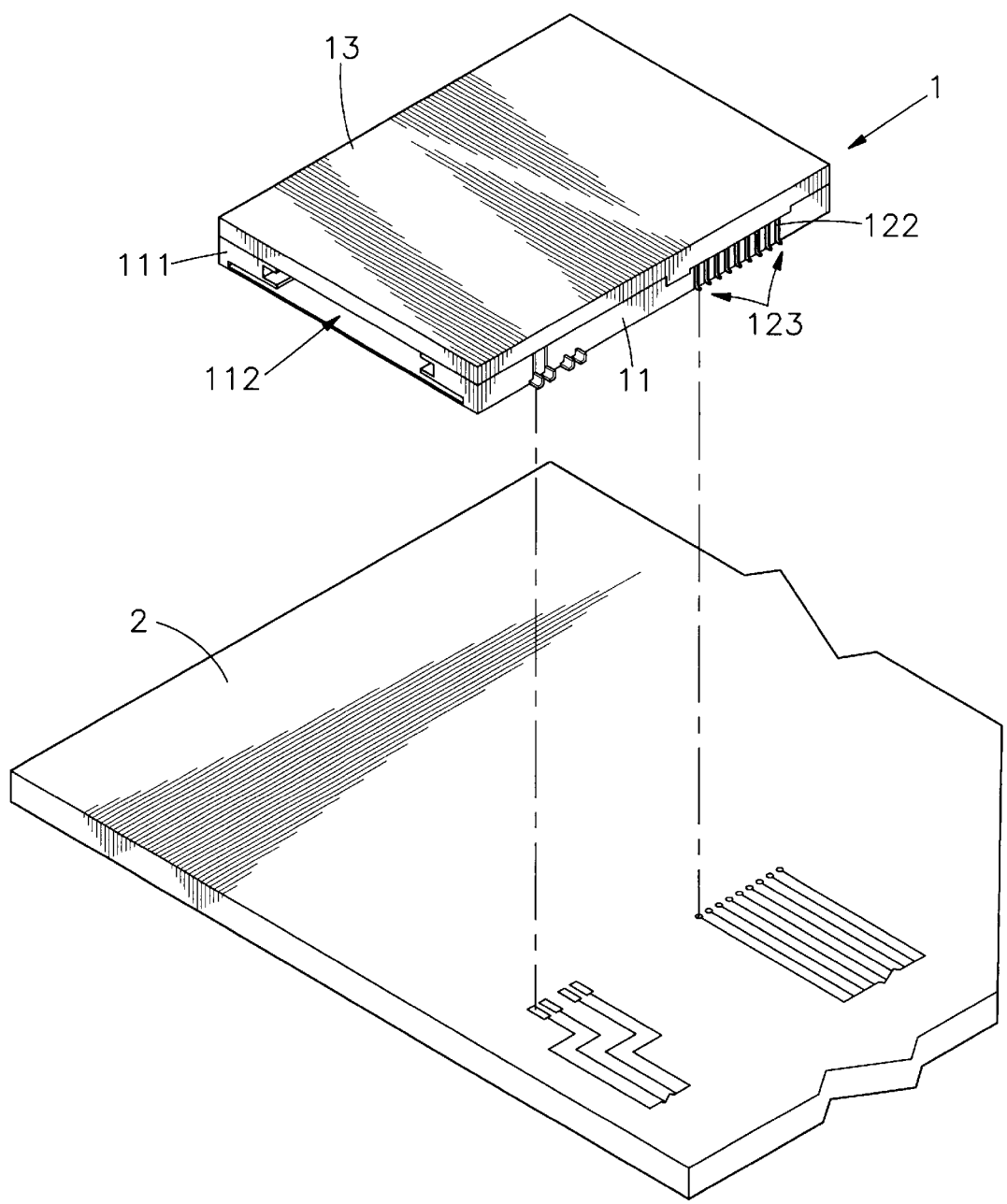
FIG. 4 is an exploded view of the multi-functional memory chip connector showing coupling, with the PCB, in accordance with an aspect of the present invention.

Reference will be made in detail to the preferred embodiments of the invention, examples of which are illustrated in the accompanying drawings. Wherever possible, the same reference numbers are used in the drawings and the description to refer to the same or like parts.

For a more complete understanding of the present invention, reference will now be made to the following detailed description of preferred embodiments taken in conjunction with the accompanying drawings, in which:

FIGS. 1, 2, 3, 3A, and 4, show a multi-functional memory chip connector 1 comprising an insulation frame 11 having a card insertion portion 111, a plurality of connecting slots 112 disposed inside a surface of the card insertion portion 111 of the insulation frame 11, a plurality of connector terminals 12 extending from the connecting slots 112. The connector terminals 12 are distributed to three sides of the insulation frame 11 and the connecting slots 112 are arranged in a stacked manner. End portions of the connector terminals 12 that are distributed toward a right side direction are extended along a right sidewall of the insulation frame 11, and a portion of a distal end of said connector terminals 12 are bent in a direction away from the right sidewall of the insulation frame 11 forming a footing structure 123. End portions of the connector terminals 12 that are distributed toward a left side direction are similarly extended along a left sidewall of the insulation frame 11, and a portion of a distal end of said connector terminals 12 is bent in a direction away from the left sidewall of the insulation frame 11 forming another footing structure 123. End portions of the connector terminals 12 that are distributed toward rear side directioniare extended along a rear sidewall of the insulation frame 11, and a portion of a distal end of said connector terminals 12 is bent in a direction assay from the real sidewall of the insulation frame 11 forming a third footing structure 123. A length of the footing structures 123 may be the same or smaller than a thickness of the insulation frame 11. An upper lid 13 is securely mounted on top of the insulation frame 11. The lid 13 and the insulated frame 11 are secured together by using adhesion, clamping, screws, or by other methods. Similarly the connector terminals 12 are also secured onto the insulation frame 11.

Further, in the above embodiment, each of the connector terminal 12 comprises at least a protruded element 121. The extending plane of protruded elements 121 of the connector terminals 12 is the same as that of connecting slots 112 of insulation frame 11. Thus, the multi-functional memory chip connector 1 will not occupy too much space when installed onto a PCB 2. Accordingly, the requirement for a thinner and smaller PCB 2 can be met.

Figure 5:
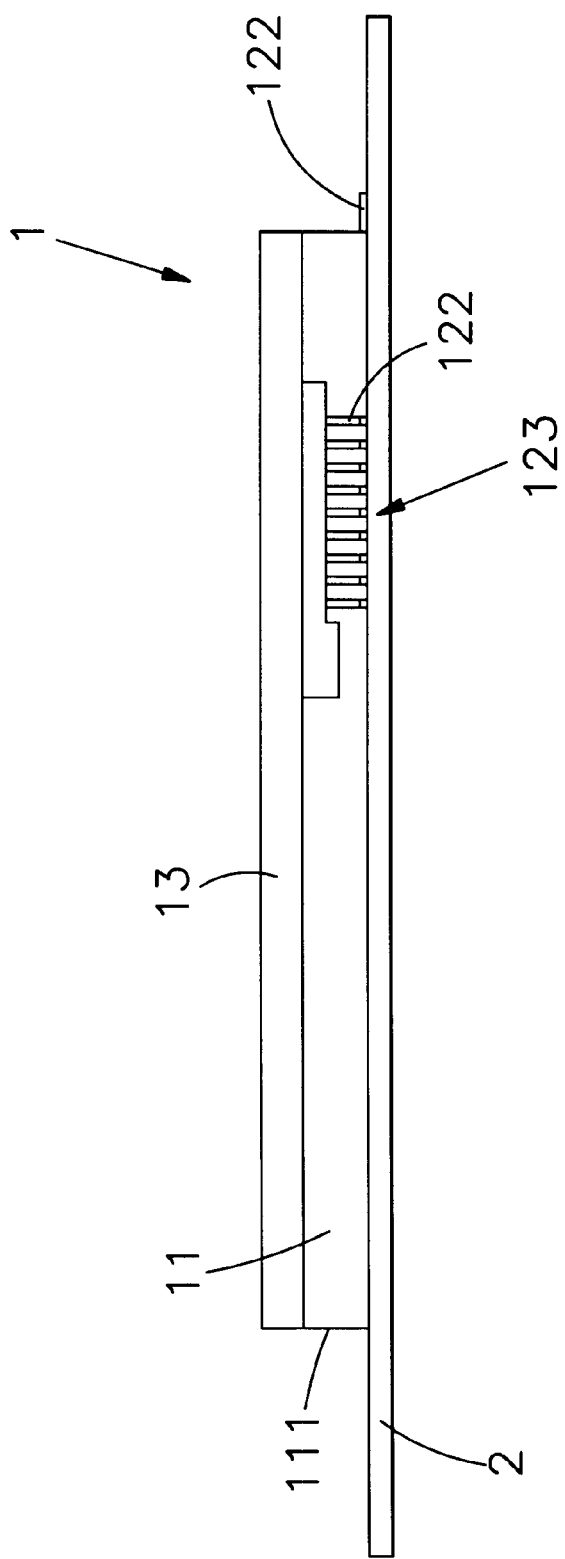
FIG. 5 is a side view, showing the multi-functional memory chip connector electrically coupled with the PCB, in accordance with an aspect of the present invention.

FIG. 5, is a side view showing the multi-functional connector 1 electrically coupled with the PCB 2 through the footing structures 123 of the connector terminal 12, according to an aspect of the present invention.

Figure 6:
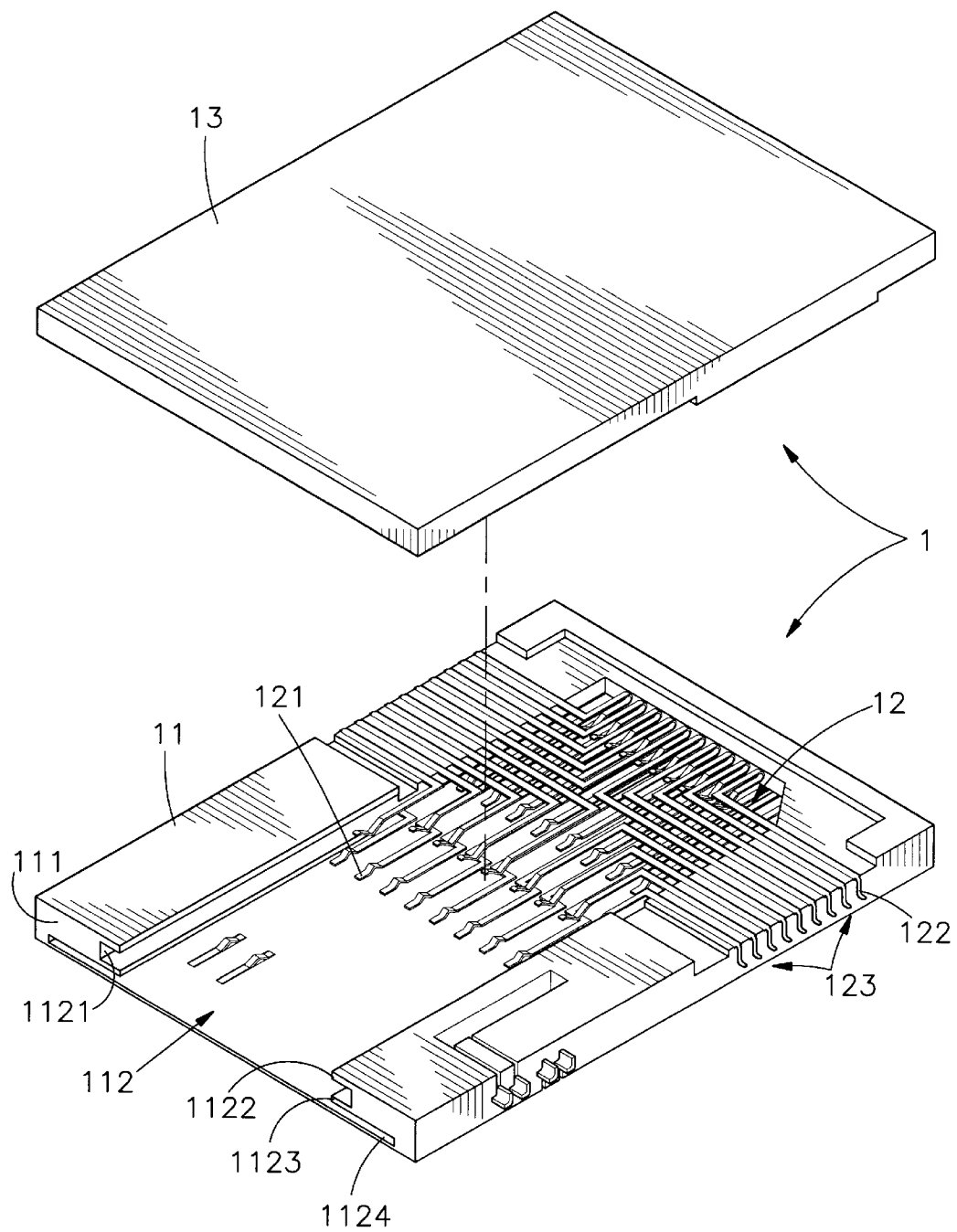
FIG. 6 is an exploded view of the multi-functional memory chip connector, in accordance with another aspect of the present invention.
Figure 7:
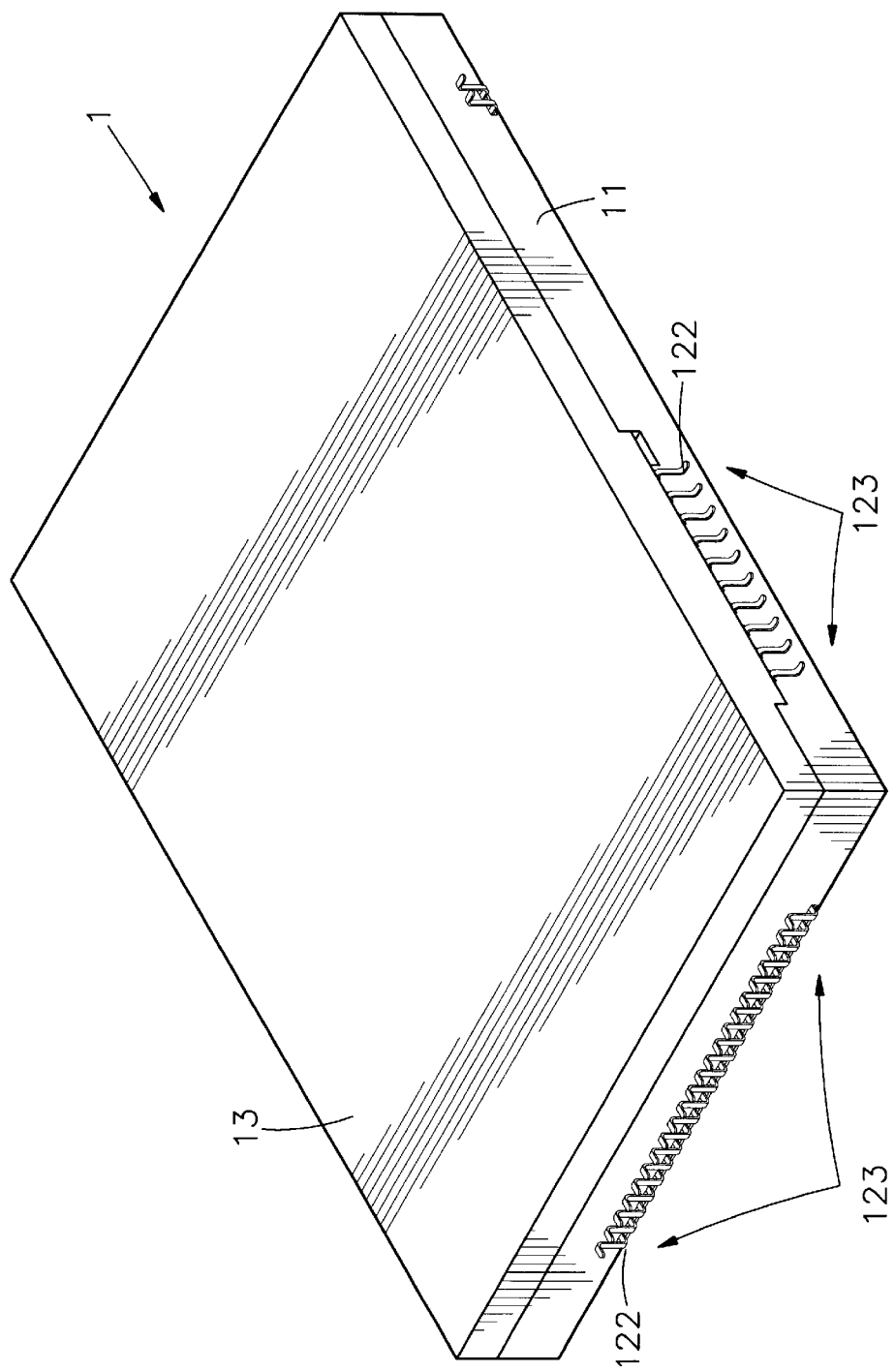
FIG. 7 is an elevational view of the multi-functional memory chip connector, in accordance with another aspect of the present invention.
Figure 8:
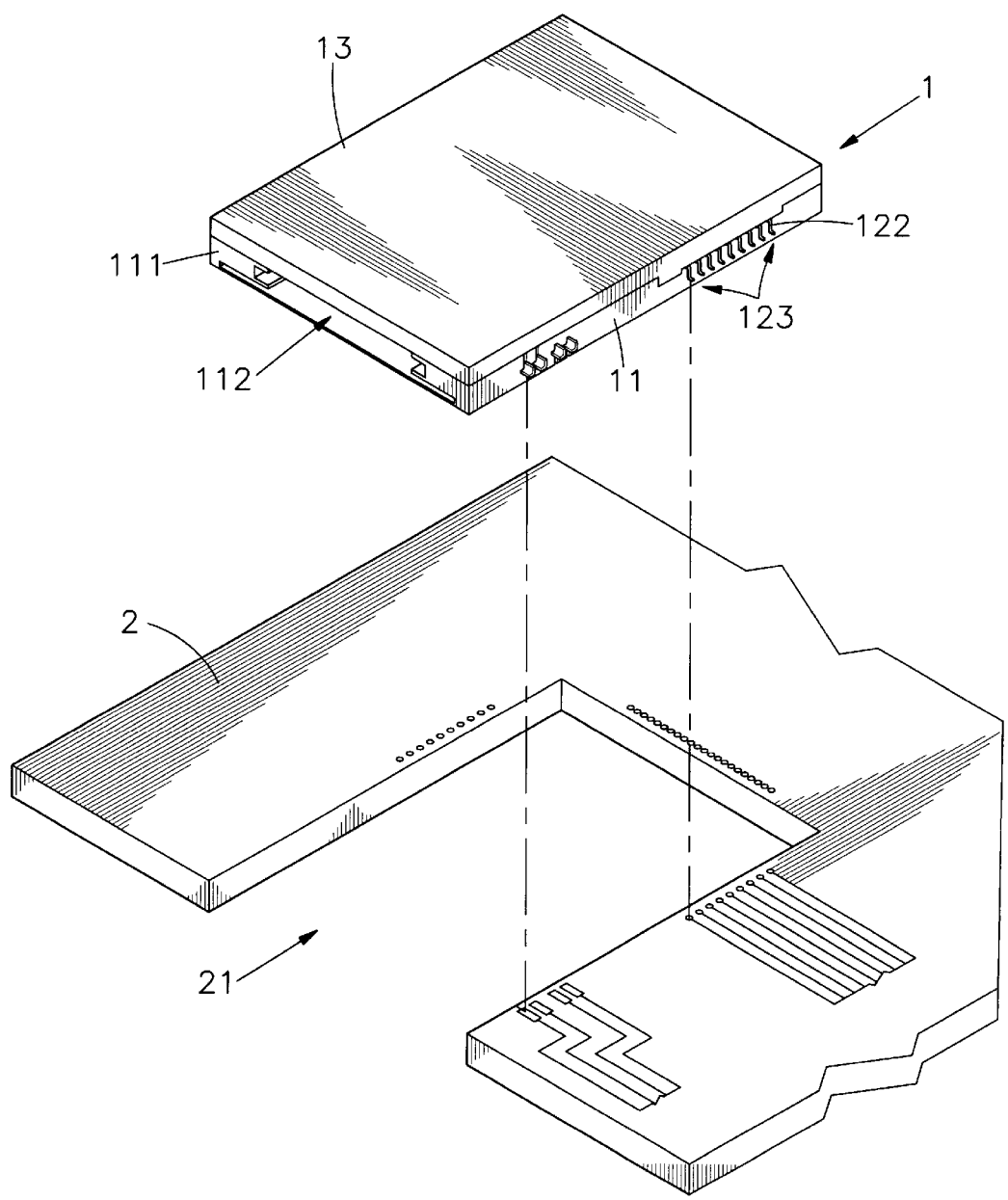
FIG. 8 is an exploded view, showing the multi-functional memory chip connector before electrically coupling with the PCB, in accordance with another aspect of the present invention.

FIGS. 6, 7, and 8, show various embodiments, in which the multi-functional memory chip connector 1 can be electrically coupled with the PCB 2 through the footing structures 123 of the connector terminals 12, according to another aspect of the present invention. More specifically, FIG. 8 shows that the multi-functional adaptor connector 1 can be positioned into a recess 21 of the insulation frame 11 corresponding to the shape of the multi-functional memory chip connector 1, in a such a manner that the footing structure 123 of the connector terminals 12 extends on to a suitable location on the PCB 2 for making electrical connection with the PCB 2.

Figure 9:
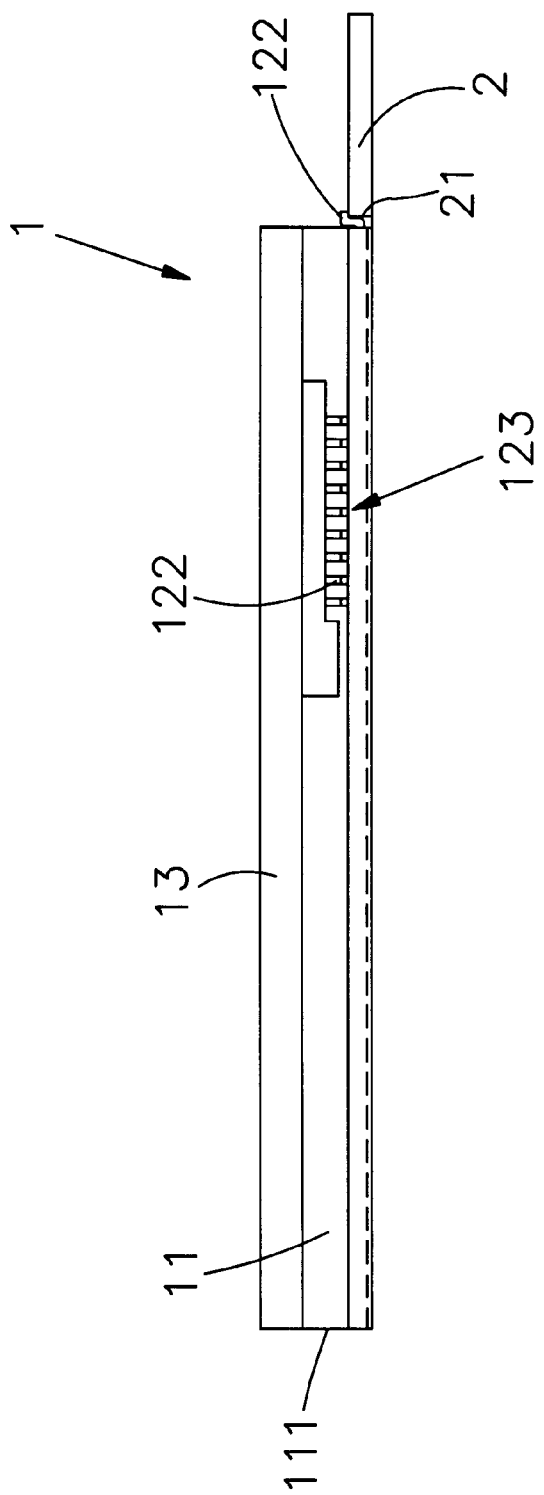
FIG. 9 is a side view, showing the multi-functional memory chip connector electrically coupling with the PCB, in accordance with another aspect of the present invention.

Referring to FIGS. 8 and 9, the multi-functional memory chip connector 1 may be electrically coupled with the PCB 2 through the footing structures 123 of the connector terminals 12, according to another aspect of the present invention. Because connecting slots 112 face towards the outer side of the PCB 2, the space required for installing the multi-functional memory chip connector 1 onto the PCB 2 will be smaller. Further, this arrangement allows an easy and fast way of inserting the memory chip into the card insertion portion 111 as there are no other devices of the PCB 2 on the outer side.

Referring back to FIG. 1, the card insertion portion 111 comprises a first insertion slot 1121, a second insertion slot 1122, a third insertion slot 1123, and a fourth insertion slot 1124, in a stacked manner, and a plurality of connector terminals 12 corresponding to each of the insertion slots which are electrically coupled to the PCB 2. Each slot corresponds to a particular type of a memory chip. Thus, a single multi-functional memory chip connector 1 of the present invention can be used for connecting a variety of memory chips.

Figure 10:
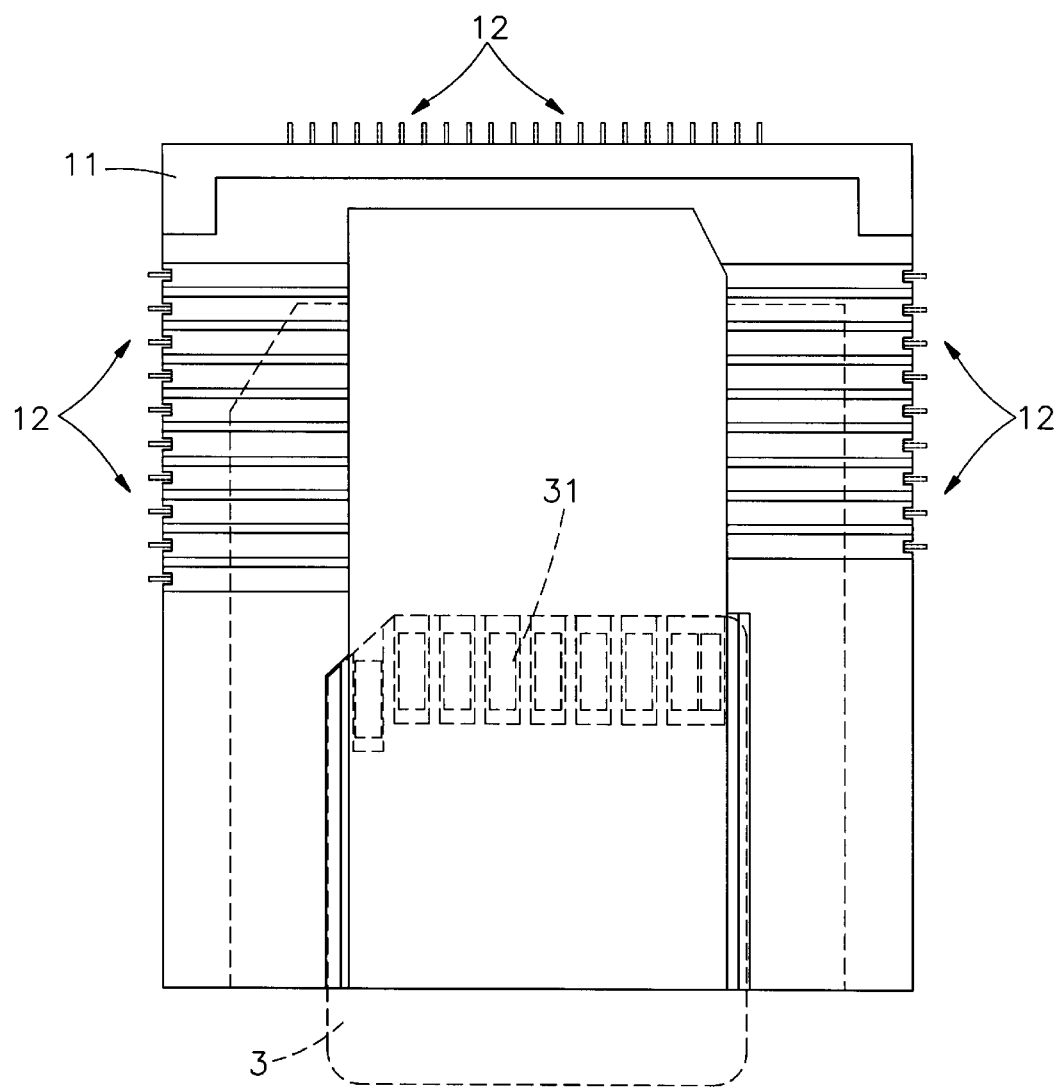
FIG. 10 is a top view, showing insertion of a MMC memory chip into the multi-functional memory chip connector, in accordance with an aspect of the present invention.
Figure 10A:
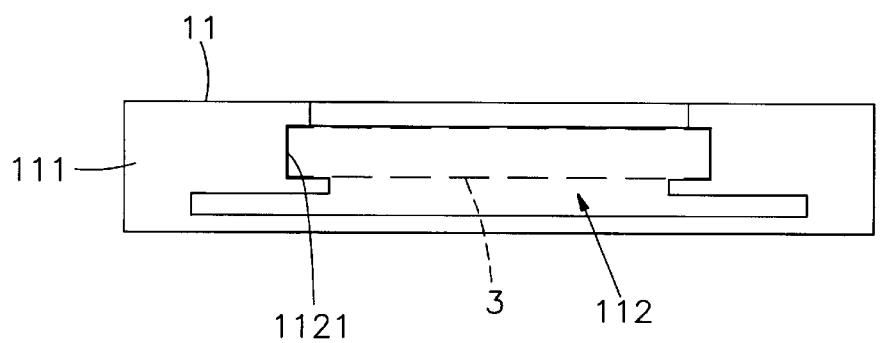
FIG. 10A is a front view, showing insertion of a MMC memory chip into the multi-functional memory chip connector, in accordance with an aspect of the present invention.

Referring to FIGS. 10 and 10A, an MMC memory chip 3 is inserted into the first slot 1121 of the card insertion portion 111 of the insulation frame 11, in accordance with an aspect of the present invention. Further, the connector 31 of the MMC memory chip 3 which is inserted into the corresponding connecting slots 112 will have the same connection specification and will match with each other.

Figure 11:
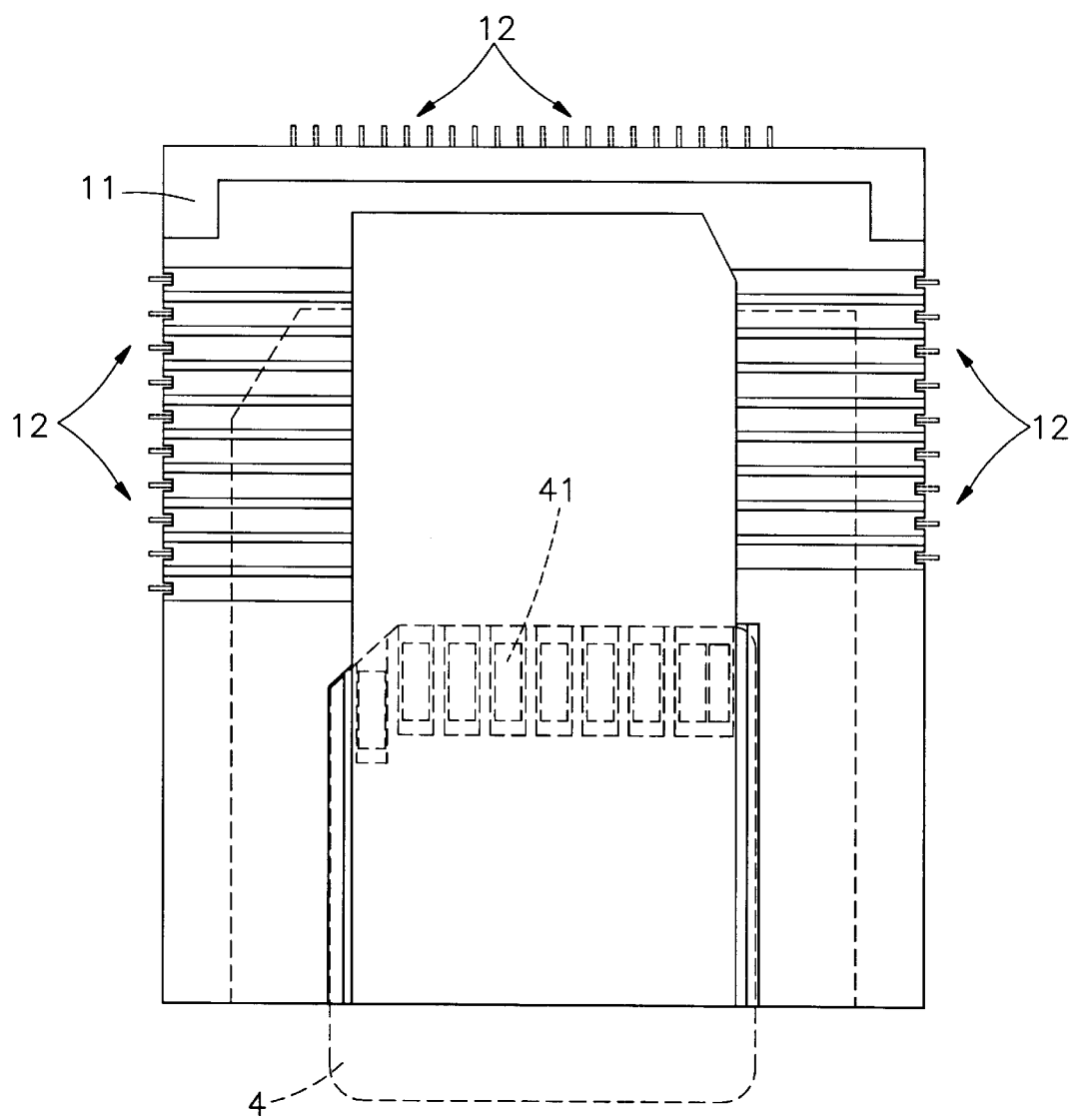
FIG. 11 is a top view, showing insertion of a SD memory chip into the multi-functional memory chip connector, in accordance with an aspect of the present invention.
Figure 11A:
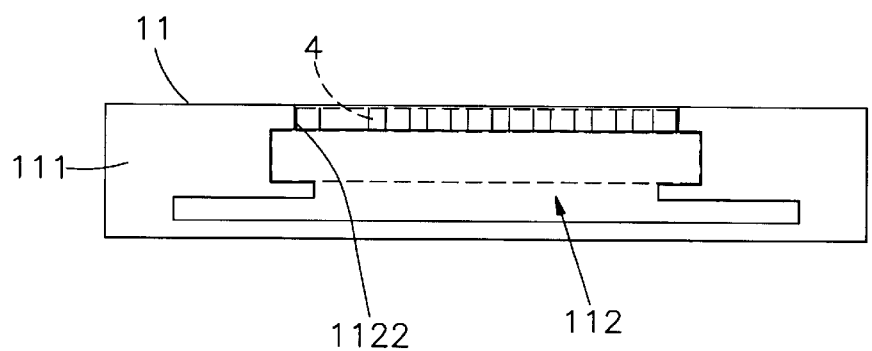
FIG. 11A is a front view, showing insertion of a SD memory chip into the multi-functional memory chip connector, in accordance with an aspect of the present invention.

FIGS. 11 and 11A show an SD memory chip 4 inserted into the second slot 1122 of the card insertion portion 111 of the insulation frame 11, in accordance with an aspect of the present invention. Further, the connector 41 of the SD memory chip 4 which is inserted into the corresponding connecting slots 112 will have the same connection specification and will match with each other.

Figure 12:
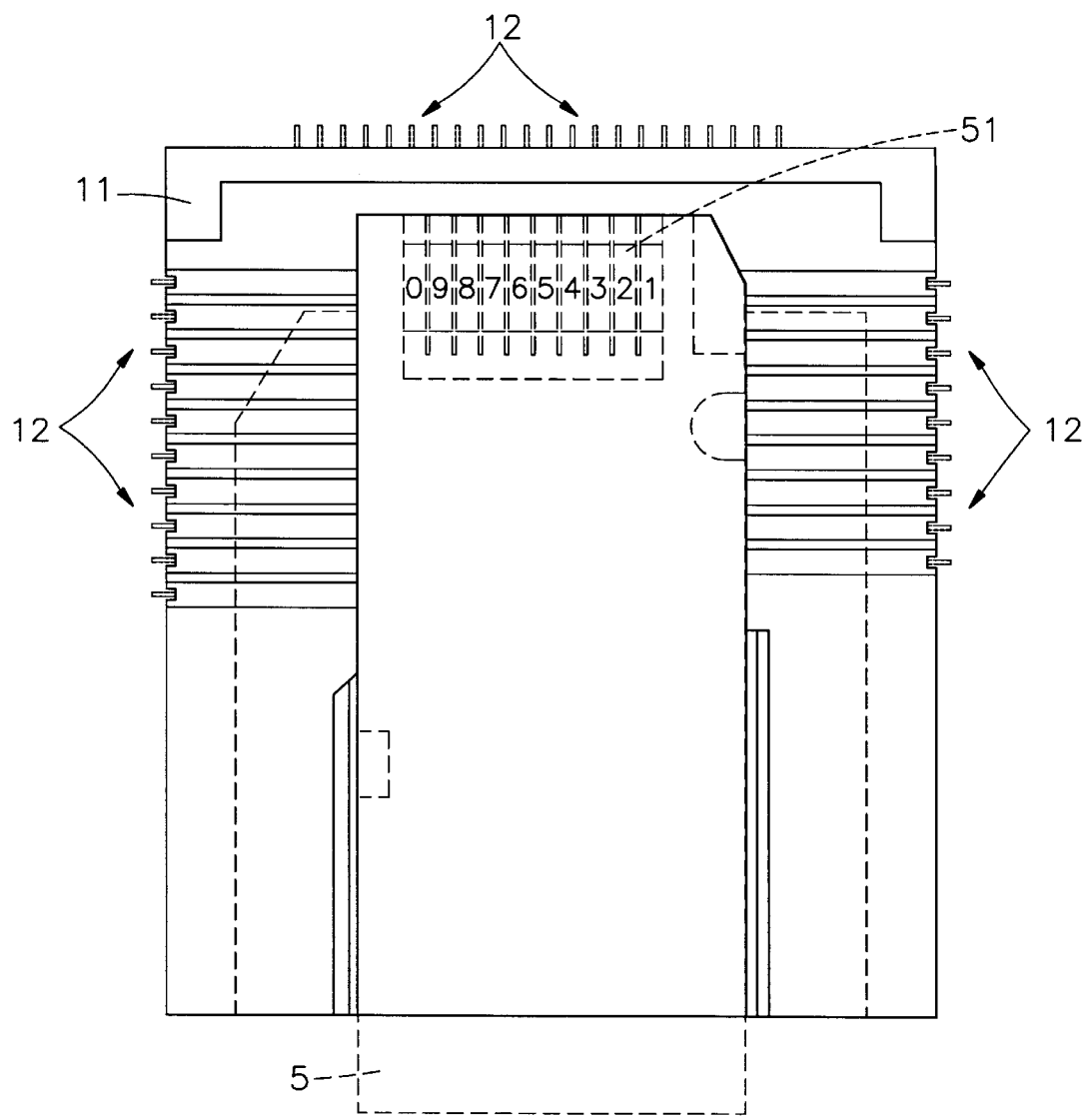
FIG. 12 is a top view, showing insertion of a MS memory chip into the multi-functional memory chip connector, in accordance with an aspect of the present invention.
Figure 12A:
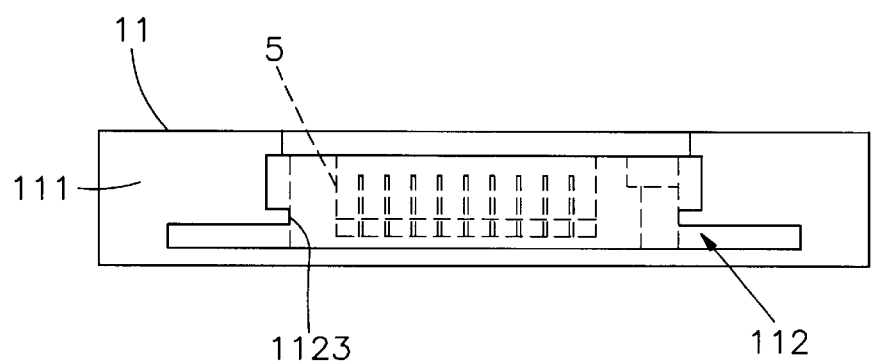
FIG. 12A is a front view, showing insertion of a MS memory chip into the multi-functional memory chip connector, in accordance with an aspect of the present invention.

Referring to FIGS. 12 and 12A, an MS memory chip 5, is inserted into the third slot 1123 of the card insertion portion 111 of the insulation frame 11, in accordance with an aspect of the present invention. Further, the connector 51 of the MS memory chip 5 which is inserted into the corresponding connecting slots 112 will have the same connection specification and will match with each other.

Figure 13:
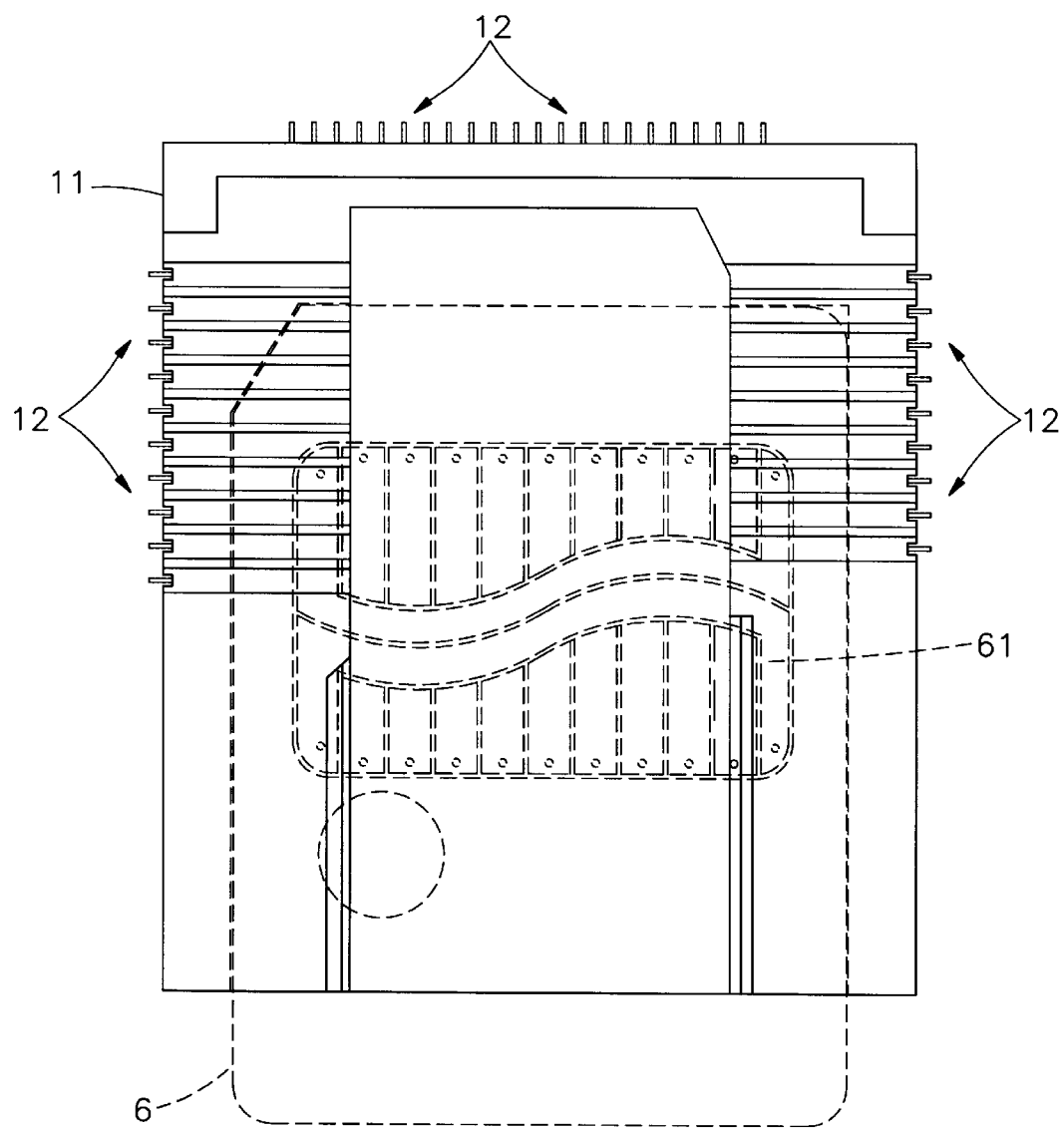
FIG. 13 is a top view, showing insertion of a SMC memory chip into the multi-functional memory chip connector, in accordance with an aspect of the present invention.
Figure 13A:
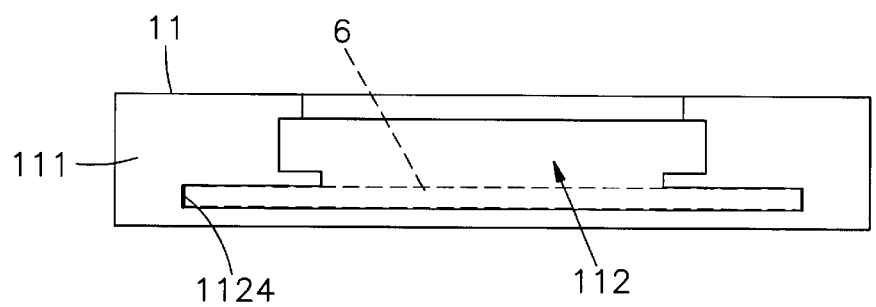
FIG. 13A is a front view, showing insertion of a SMC memory chip into the multi-functional memory chip connector, in accordance with an aspect of the present invention.

Referring to FIGS. 13 and 13A, an SMC memory chip 6 is inserted into the fourth slot 1124 of the card insertion portion 111 of the insulation frame 11, in accordance with an aspect of the present invention. Further, the connector 61 of the SMC memory chip 6 which is inserted into the corresponding connecting slots 112 will have the same connection specification and will match with each other.

Further referring to FIGS. 11, 11A, 12, 12A, 13 and 13A, the connecting slots 112 of the insulation frame 11 connect a variety of memory chips (3, 4, 5, and 6) with the PCB 2. The second insertion slot 1122 is for connecting the SD memory chip 4, and the fourth insertion slot 1124 is for connecting SMC memory chip 6. The third insertion slot 1123 which is formed between the second insertion slot 1122 and fourth insertion slot 1124 is for connecting the MS memory chip 5, and since these insertion slots are disposed in a stacked manner, the space required for the third insertion slots 1123 in the insulation frame 11 can be smaller, allowing further shrinkage in the size of the multi-functional memory chip connector 1.

While the invention has been described in conjunction with a specific best mode, it is to be understood that many alternatives, modifications, and variations will be apparent to those skilled in the art in light of the a foregoing, description. Accordingly, it is intended to embrace all such alternatives, modifications, and variations which fall within the spirit and scope of the included claims. All matters set forth herein or shown in the accompanying, drawings arc to be interpreted in an illustrative and non-limiting sense.

What the claimed is:

1. A multi-functional memory chip connector, comprising:
   an insulation frame including a memory chip insertion portion;
   a plurality of connecting slots on an inside a surface of the memory chip insertion portion;
   a plurality of connector terminals extending front the connecting slots and distributed to three sides of the insulation frame to form distributed left-side, right-side, and rear-side connector terminals, wherein respective first end portions of said distributed connector terminals extend along corresponding sidewalls on the three sides of the insulation frame and protrude in a direction away from the corresponding sidewalls to form respective left-side, right-side, and rear-side footing structures arranged to be electrically connected to respective sets of terminals on a circuit board;
   a plurality of insertion slots extending from a front side of said connector, for receiving a variety of memory chips, wherein second end portions of said distributed connector terminals extend into said insertion slots for electrical connection to said variety of memory chips; and
   an upper lid for mounting on the top of insulation frame.

2. The multi-functional memory chip connector according to claim 1, wherein, said connecting slots further comprises a first connecting slot, a second connecting slot, a third connecting slot, and a fourth connecting slot.

3. The multi-functional memory chip connector according to claim 2, wherein the connector terminals correspond to said first, second, third and fourth connecting slots.

4. The multi-functional memory chip connector according to claim 2, wherein said second connecting slot is for electrically coupling with an SD memory chip and said fourth connecting slot is for elecetrically coupling with an SMC memory chip, and said third connecting slot which is located between said second and fourth connecting slots, is for electrically coupling with an MS memory chip, and wherein said third connecting slot is stacked within said second and fourth connecting slot.

5. The multi-functional memory chip connector according to claim 2, wherein said first, second, third, and fourth connecting slots are arranged in stacked manner for shrinking space occupation on a circuit board.

6. The multi-functional memory chip connector according to claim 1, wherein a length of said footing structures of the connector terminals is equal to a thickness of said insulation frame.

7. The multi-functional memory chip connector according to claim 1, wherein a length of said footing structures of the connector terminals is smaller than a thickness of said insulation frame.

8. The multi-functional memory chip connector according to claim 1, wherein the plane of extension of said connector terminals that extend into the connecting slots is coplanar with a plane of the insertion slots.

* * * * *